United States Patent
Kim

(10) Patent No.: US 10,049,708 B2
(45) Date of Patent: Aug. 14, 2018

(54) SEMICONDUCTOR DEVICE AND SEMICONDUCTOR SYSTEM

(71) Applicant: SK hynix Inc., Icheon-si Gyeonggi-do (KR)

(72) Inventor: Jae Il Kim, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/614,097

(22) Filed: Jun. 5, 2017

(65) Prior Publication Data
US 2017/0365311 A1  Dec. 21, 2017

(30) Foreign Application Priority Data
Jun. 17, 2016 (KR) .................. 10-2016-0075494

(51) Int. Cl.
| | |
|---|---|
| G11C 8/18 | (2006.01) |
| G11C 7/22 | (2006.01) |
| H03L 7/081 | (2006.01) |
| H03L 7/06 | (2006.01) |
| H03K 19/096 | (2006.01) |
| H03K 19/00 | (2006.01) |
| H03K 19/017 | (2006.01) |

(52) U.S. Cl.
CPC .............. *G11C 7/222* (2013.01); *G11C 7/225* (2013.01); *G11C 8/18* (2013.01); *H03K 19/0016* (2013.01); *H03K 19/01728* (2013.01); *H03K 19/096* (2013.01); *H03L 7/06* (2013.01); *H03L 7/0818* (2013.01)

(58) Field of Classification Search
CPC .................................... G11C 7/22; G11C 8/18
USPC .......................................... 365/233.1, 189.05
See application file for complete search history.

(56) References Cited

U.S. PATENT DOCUMENTS

| | | | | | |
|---|---|---|---|---|---|
| 5,160,894 | A | * | 11/1992 | Westwick ................. | G06F 1/04 327/107 |
| 5,373,255 | A | * | 12/1994 | Bray .................... | H03D 13/004 327/159 |
| 5,517,155 | A | * | 5/1996 | Yamauchi ................. | H03L 7/08 327/107 |
| 5,977,837 | A | * | 11/1999 | Byrn ........................ | G06F 1/10 327/115 |
| 6,122,337 | A | * | 9/2000 | Bleiweiss ............. | H03L 7/0992 370/395.62 |
| 6,182,237 | B1 | * | 1/2001 | Bronson ............ | G01R 31/3016 713/503 |

(Continued)

FOREIGN PATENT DOCUMENTS

KR     100610439 B1    8/2006

*Primary Examiner* — Michael Tran
(74) *Attorney, Agent, or Firm* — William Park & Associates Ltd.

(57) ABSTRACT

A semiconductor device may include a division control circuit and a latch circuit. The division control circuit may be configured to divide an external clock to generate a first preliminary divided clock and a second preliminary divided clock. The division control circuit may be configured to output the first and second preliminary divided clocks or any one of the first and second preliminary divided clocks as first and second divided clocks. The latch circuit may be configured to latch an external control signal in response to the first and second divided clocks and configured to output latched signals as first and second latch control signals.

17 Claims, 5 Drawing Sheets

(56) References Cited

U.S. PATENT DOCUMENTS

| | | | |
|---|---|---|---|
| 6,201,423 B1* | 3/2001 | Taguchi | G06F 13/4243 327/141 |
| 6,259,291 B1* | 7/2001 | Huang | G06F 1/08 327/115 |
| 6,812,750 B1* | 11/2004 | Henrion | G06F 1/04 327/115 |
| 7,165,183 B2* | 1/2007 | Okada | G06F 1/3203 700/295 |
| 9,088,287 B2* | 7/2015 | Choi | H03K 23/667 |
| 2003/0031060 A1* | 2/2003 | Nishio | G11C 7/1078 365/189.12 |
| 2004/0000934 A1* | 1/2004 | Jeon | H03K 21/10 327/115 |
| 2005/0083280 A1* | 4/2005 | Hiraki | G09G 3/2092 345/87 |
| 2007/0147166 A1* | 6/2007 | Lee | G11C 7/1012 365/189.15 |
| 2007/0230266 A1* | 10/2007 | Kao | G11C 7/1051 365/189.16 |
| 2007/0291576 A1* | 12/2007 | Yang | G11C 7/1039 365/230.08 |
| 2008/0101140 A1* | 5/2008 | Jeong | G11C 7/22 365/193 |
| 2008/0143404 A1* | 6/2008 | Shim | H03K 5/15 327/158 |
| 2009/0289659 A1* | 11/2009 | Kuwahara | G11C 7/1078 326/30 |
| 2009/0290445 A1* | 11/2009 | Kinoshita | G11C 7/1066 365/230.08 |
| 2010/0052739 A1* | 3/2010 | Shibata | G11C 7/1072 327/117 |
| 2010/0128543 A1* | 5/2010 | Kwon | G11C 7/22 365/193 |
| 2010/0177589 A1* | 7/2010 | Kinoshita | G11C 7/1027 365/233.11 |
| 2010/0182062 A1* | 7/2010 | Kamath | H03H 17/0628 327/162 |
| 2011/0057691 A1* | 3/2011 | Hirashima | H03L 7/07 327/152 |
| 2014/0021990 A1* | 1/2014 | Na | H03L 7/10 327/158 |
| 2016/0109519 A1* | 4/2016 | Vadhavania | G01R 31/31701 714/731 |
| 2017/0330278 A1* | 11/2017 | Radulescu | G06Q 40/04 |

\* cited by examiner

SEMICONDUCTOR DEVICE AND SEMICONDUCTOR SYSTEM

CROSS-RELATED APPLICATION

This application claims priority under 35 USC § 119 to Korean Patent Application No 10-2016-0075494, filed on Jun. 17, 2016, in the Korean Intellectual Property Office (KIPO), the contents of which are herein incorporated by reference in their entirety.

BACKGROUND

1. Technical Field

Example embodiments relate to a semiconductor integrated circuit device. More particularly, example embodiments relate to a semiconductor device and a semiconductor system.

2. Description of the Related Art

As a semiconductor device may have a rapid speed, the semiconductor device may use a clock for effectively transceiving signals from/to an external device.

As the signal transception between the semiconductor device and the external device may become faster, a frequency of the clock may become higher.

Thus, it may be required to change a design of the semiconductor device in proportion to the high frequency of the clock.

SUMMARY

According to example embodiments, there may be provided a semiconductor device. The semiconductor device may include a division control circuit and a latch circuit. The division control circuit may be configured to divide an external clock to generate a first preliminary divided clock and a second preliminary divided clock. The division control circuit may be configured to output the first and second preliminary divided clocks or any one of the first and second preliminary divided clocks as first and second divided clocks. The latch circuit may be configured to latch an external control signal in response to the first and second divided clocks and configured to output latched signals as first and second latch control signals.

According to example embodiments, there may be provided a semiconductor system. The semiconductor system may include an external device and a semiconductor device. The external device may be configured to provide an external control signal and an external clock. The semiconductor device may be configured to divide the external clock to generate a plurality of divided clocks. The semiconductor device may be configured to latch the external control signal using the divided clocks or at least one of the divided clocks.

BRIEF DESCRIPTION OF THE DRAWINGS

Example embodiments will be more clearly understood from the following detailed description taken in conjunction with the accompanying drawings.

FIG. 1 is a circuit diagram illustrating a semiconductor device in accordance with example embodiments;

FIG. 2 is a circuit diagram illustrating a division control circuit illustrated in FIG. 1;

FIG. 3 is a circuit diagram illustrating a first latch illustrated in FIG. 2;

FIG. 4 is a circuit diagram illustrating a first output control circuit illustrated in FIG. 2;

FIG. 5 is a circuit diagram illustrating a latch circuit illustrated in FIG. 1; and FIG. 6 is a block diagram illustrating a semiconductor system in accordance with example embodiments.

DETAILED DESCRIPTION OF THE EMBODIMENTS

Figure 1:
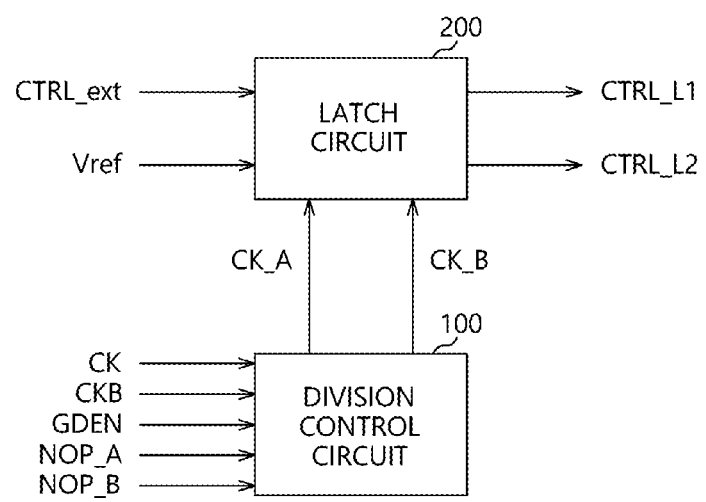
FIGS. 1 to 6 represent non-limiting, example embodiments as described herein.

Various example embodiments will be described more fully hereinafter with reference to the accompanying drawings, in which some example embodiments are shown. The present disclosure may, however, be embodied in many different forms and should not be construed as limited to the example embodiments set forth herein. Rather, these example embodiments are provided so that this disclosure will be thorough and complete, and will fully conveys a scope of the present disclosure to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "above," "upper" and the like, may be used herein for ease of description to describe one element or feature's relationship to another element(s) or feature(s) as illustrated in the figures. It will be understood that spatially relative terms are intended to encompass different orientations of a device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a circuit diagram illustrating a semiconductor device in accordance with example embodiments.

Referring to FIG. 1, a semiconductor device 300 may include a division control circuit 100 and a latch circuit 200.

The division control circuit 100 may be configured to generate a first divided clock CK_A and a second divided clock CK_B in response to an external clock CK, an external clock bar CKB, a gear down enabling signal GDEN, a first no-operation instruction (NOP) signal NOP_A, and a second NOP signal NOP_B. For example, the division control circuit 100 may divide the external clock CK and the external clock bar CKB to generate the first divided clock CK_A and the second divided clock CK_B. The division control circuit 100 may output the first and second divided clocks CK_A and CK_B or any one of the first and second divided clocks CK_A and CK_B in response to the gear down enabling signal GDEN and the first NOP signal NOP_A and the second NOP signal NOP_B. The gear down enabling signal GDEN may include an output signal from a mode register set configured to change set-ups of the semiconductor device. The first and second NOP signals NOP_A and NOP_B may correspond to a command signal CMD inputted from an external device (See FIG. 6).

When an external voltage is not applied to the semiconductor device, i.e., before the semiconductor device performs a power-up operation by applying the external voltage or when the semiconductor device performs an operation for maintaining data, i.e., a self-refresh operation, the semiconductor device does not receive the external clock CK. Thus, when the semiconductor device performs the power-up operation or the semiconductor device is not in the self-refresh operation mode, setup changes of the mode register set may determine how the external clock CK may be used. That is, when the semiconductor device performs the power-up operation or the semiconductor device is not in the self-refresh operation mode, whether or not a gear down enabling signal GDEN is enabled may be determined by changing the setup of the mode register set. The setup of the mode register set may be changed by an address inputted together with a specific command such as a combination of RAS, CAS, WE and CKE.

The latch circuit 200 may be configured to generate a first latch control signal CTRL_L1 and a second latch control signal CTRL_L2 in response to a reference voltage Vref, an external control signal CTRL_ext and the first and second divided clocks CK_A and CK_B. For example, the latch circuit 200 may buffer the external control signal CTRL_ext based on the reference voltage Vref. The latch circuit 200 may latch the buffered external control signal CTRL_ext in response to the first and second divided clocks CK_A and CK_B to output the first and second latch control signals CTRL_L1 and CTRL_L2.

Particularly, the latch circuit 200 may synchronize the external control signal CTRL_ext with the first divided clock CK_A to generate the first latch control signal CTRL_L1. The latch circuit 200 may synchronize the external control signal CTRL_ext with the second divided clock CK_B to generate the second latch control signal CTRL_L2. The external control signal CTRL_ext may correspond to a command or an address inputted from the external device.

Figure 2:
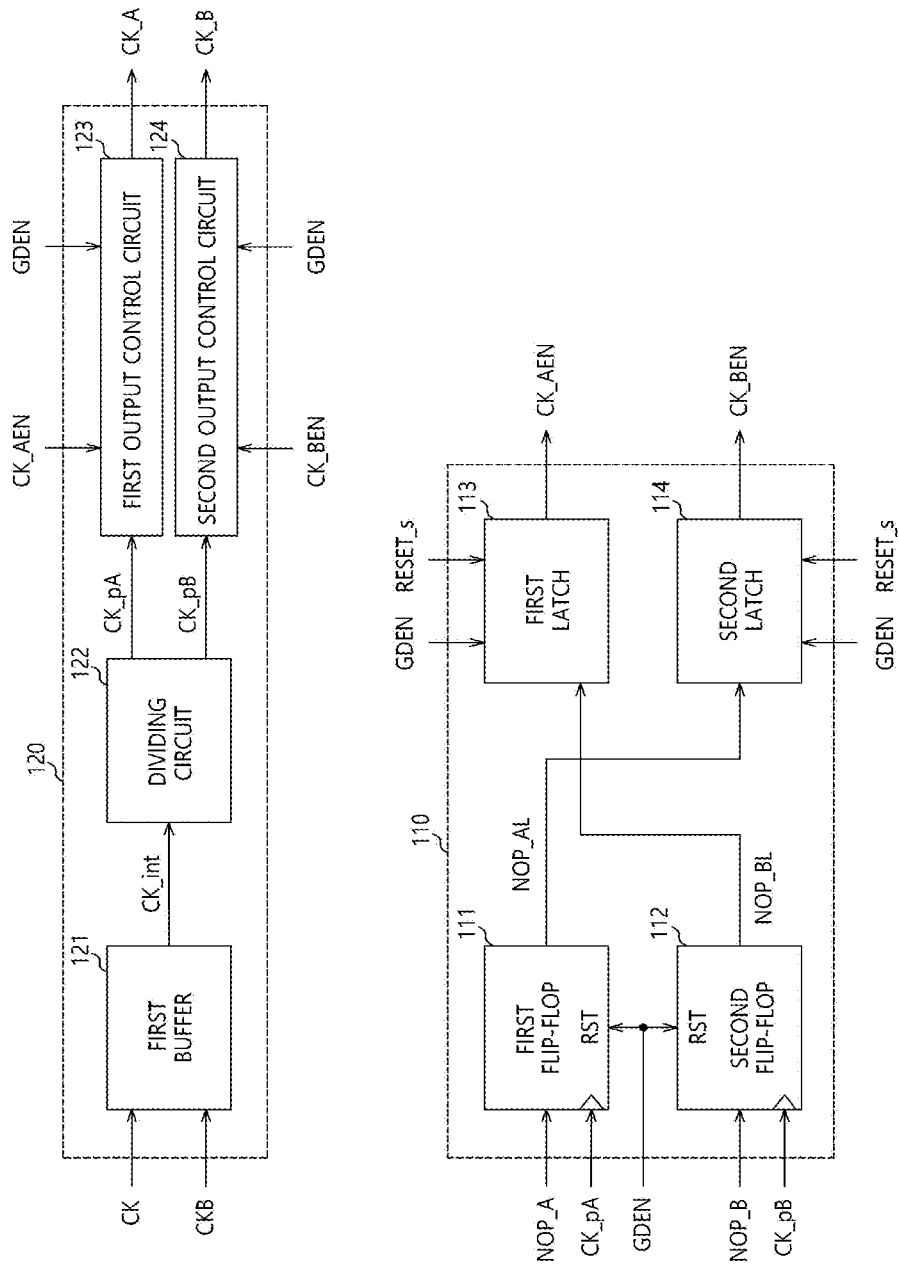

FIG. 2 is a circuit diagram illustrating a division control circuit illustrated in FIG. 1.

Referring to FIG. 2, the division control circuit 100 may include a control signal-generating circuit 110 and a divided clock generation control circuit 120.

The control signal-generating circuit 110 may be configured to generate a first divided clock output enabling signal CK_AEN and a second divided clock output enabling signal CK_BEN in response to the gear down enabling signal GDEN, first and second preliminary divided clocks CK_pA and CK_pB, and the first and second NOP signals NOP_A and NOP_B. For example, when the gear down enabling signal GDEN is disabled, the control signal-generating circuit 110 may enable any one of the first and second divided clock output enabling signals CK_AEN and CK_BEN regardless of the state of any one of the first and second NOP signals NOP_A and NOP_B. When the gear down enabling signal GDEN is enabled, the control signal-generating circuit 110 may enable any one of the first and second divided clock output enabling signals CK_AEN and CK_BEN in response to the first and second NOP signals NOP_A and NOP_B.

Particularly, when the gear down enabling signal GDEN and the first NOP signal NOP_A are enabled, the control signal-generating circuit 110 may enable the first divided clock output enabling signal CK_AEN and disable the second divided clock output enabling signal CK_BEN. When the gear down enabling signal GDEN and the second NOP signal NOP_B are enabled, the control signal-generating circuit 110 may disable the first divided clock output enabling signal CK_AEN and enable the second divided clock output enabling signal CK_BEN.

The control signal-generating circuit 110 may include a first flip-flop 111, a second flip-flop 112, a first latch 113, and a second latch 114.

The first flip-flop 111 may latch the first NOP signal NOP_A in response to the gear down enabling signal GDEN and the first preliminary divided clock CK_pA. The first flip-flop 111 may output a latched signal as a first latch NOP signal NOP_AL. For example, when the gear down enabling signal GDEN is enabled, the first flip-flop 111 may latch the first NOP signal NOP_A in response to the first preliminary divided clock CK_pA. The first flip-flop 111 may output a latched signal as the first latch NOP signal NOP_AL. When the gear down enabling signal GDEN is disabled, the first flip-flop 111 may disable the first latch NOP signal NOP_AL regardless of the state of the first preliminary divided clock CK_pA and the first NOP signal NOP_A.

The first NOP signal NOP_A may be inputted into an input terminal of the first flip-flop 111. The first preliminary divided clock CK_pA may be inputted into a clock input terminal of the first flip-flop 111. The gear down enabling signal GDEN may be inputted into a reset terminal of the first flip-flop 111. The first latch NOP signal NOP_AL may be outputted from an output terminal of the first flip-flop 111.

The second flip-flop 112 may latch the second NOP signal NOP_B in response to the gear down enabling signal GDEN and the second preliminary divided clock CK_pB. The second flip-flop 112 may output a latched signal as a second latch NOP signal NOP_BL. For example, when the gear down enabling signal GDEN is enabled, the second flip-flop 112 may latch the second NOP signal NOP_B in response to the second preliminary divided clock CK_pB. The second flip-flop 112 may output a latched signal as the second latch NOP signal NOP_BL. When the gear down enabling signal GDEN is disabled, the second flip-flop 112 may disable the second latch NOP signal NOP_BL regardless of the state of the second preliminary divided clock CK_pB and the second NOP signal NOP_B.

The second NOP signal NOP_B may be inputted into an input terminal of the second flip-flop 112. The second preliminary divided clock CK_pB may be inputted into a clock input terminal of the second flip-flop 112. The gear down enabling signal GDEN may be inputted into a reset terminal of the second flip-flop 112. The second latch NOP signal NOP_BL may be outputted from an output terminal of the second flip-flop 112.

The first latch 113 may be configured to generate the first divided clock output enabling signal CK_AEN in response to at least one of the gear down enabling signal GDEN, the second latch NOP signal NOP_BL, and a reset signal RESET_s when, in one example, the gear down enabling signal GDEN is enabled. For example, when the gear down enabling signal GDEN is disabled or the reset signal RESET_s is enabled, the first latch 113 may enable the first divided clock output enabling signal CK_AEN regardless of the state of the second latch NOP signal NOP_BL. When the second latch NOP signal NOP_BL is enabled under conditions that the gear down enabling signal GDEN is enabled and the reset signal RESET_s is disabled, the first latch 113 may disable the first divided clock output enabling signal CK_AEN. When the second latch NOP signal NOP_BL is disabled under conditions that the gear down enabling signal GDEN is enabled and the reset signal RESET_s is disabled, the first latch 113 may enable the first divided clock output enabling signal CK_AEN.

Figure 3:
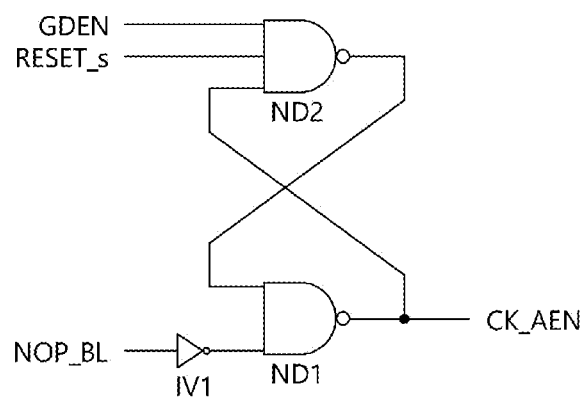

FIG. 3 is a circuit diagram illustrating a first latch illustrated in FIG. 2.

Referring to FIG. 3, the first latch 113 may include a first inverter IV1, a first NAND gate ND1, and a second NAND gate ND2. The first inverter IV1 may receive the second latch NOP signal NOP_BL. The first NAND gate ND1 may receive output signals from the first inverter IV1 and the second NAND gate ND2. The second NAND gate ND2 may receive the gear down enabling signal GDEN, the reset signal RESET_s, and an output signal from the first NAND gate ND1. The output signal of the first NAND gate ND1 may be outputted as the first divided clock output enabling signal CK_AEN.

Returning to FIG. 2, the second latch 114 may be configured to generate the second divided clock output enabling signal CK_BEN in response to at least one of the gear down enabling signal GDEN, the first latch NOP signal NOP_AL, and the reset signal RESET_s when, in one example, the gear down enabling signal GDEN is enabled. For example, when the gear down enabling signal GDEN is disabled or the reset signal RESET_s is enabled, the second latch 114 may enable the second divided clock output enabling signal CK_BEN regardless of the state of the first latch NOP signal NOP_AL. When the first latch NOP signal NOP_AL is enabled under conditions that the gear down enabling signal GDEN is enabled and the reset signal RESET_s is disabled, the second latch 114 may disable the second divided clock output enabling signal CK_BEN. When the first latch NOP signal NOP_AL is disabled under conditions that the gear down enabling signal GDEN is enabled and the reset signal RESET_s is disabled, the second latch 114 may enable the second divided clock output enabling signal CK_BEN.

The second latch 114 may have configurations substantially the same as those of the first latch 113 except that the first latch NOP signal NOP_AL may be inputted into the second latch 114.

The divided clock generation control circuit 120 may include a first buffer 121, a dividing circuit 122, a first output control circuit 123, and a second output control circuit 124.

The first buffer 121 may be configured to buffer the external clock CK and the external clock bar CKB. The first buffer 121 may output the buffered clocks as an internal clock CK_int.

The dividing circuit 122 may be configured to generate the first preliminary divided clock CK_pA and the second preliminary divided clock CK_pB in response to the internal clock CK_int. For example, the dividing circuit 122 may divide the internal clock CK_int to generate the first and second preliminary divided clocks CK_pA and CK_pB having different phases. Particularly, the dividing circuit 122 may divide the internal clock CK_int into the first and second preliminary divided clocks CK_pA and CK_pB having opposite phases.

The first output control circuit 123 may be configured to output the first preliminary divided clock CK_pA as the first divided clock CK_A in response to the first divided clock output enabling signal CK_AEN and the gear down enabling signal GDEN. For example, when the first divided clock output enabling signal CK_AEN is enabled and the gear down enabling signal GDEN is disabled, the first output control circuit 123 may output the first preliminary divided clock CK_pA as the first divided clock CK_A. When the first divided clock output enabling signal CK_AEN is disabled and the gear down enabling signal GDEN is enabled, the first output control circuit 123 may fix the first divided clock CK_A to a specific level.

The second output control circuit 124 may be configured to output the second preliminary divided clock CK_pB as the second divided clock CK_B in response to the second divided clock output enabling signal CK_BEN and the gear down enabling signal GDEN. For example, when the second divided clock output enabling signal CK_BEN is enabled and the gear down enabling signal GDEN is disabled, the second output control circuit 124 may output the second preliminary divided clock CK_pB as the second divided clock CK_B. When the second divided clock output enabling signal CK_AEN is disabled and the gear down enabling signal GDEN is enabled, the second output control circuit 124 may fix the second divided clock CK_B to a specific level.

Figure 4:
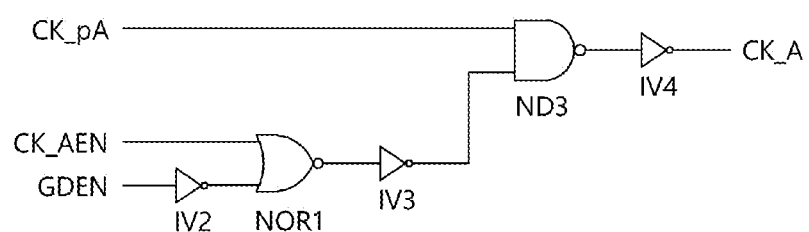

FIG. 4 is a circuit diagram illustrating a first output control circuit illustrated in FIG. 2.

Referring to FIG. 4, the first output control circuit 123 may include a second inverter IV2, a third inverter IV3, a fourth inverter IV4, a NOR gate NOR1, and a third NAND gate ND3. The second inverter IV2 may receive the gear down enabling signal GDEN. The NOR gate NOR1 may receive the first divided clock output enabling signal CK_AEN and an output signal from the second inverter IV2. The third inverter IV3 may receive an output signal from the NOR gate NOR1. The third NAND gate ND3 may receive the first preliminary divided clock CK_pA and an output signal from the third inverter IV3. The fourth inverter IV4 may receive an output signal from the third NAND gate ND3. The fourth inverter IV4 may output the inputted signal as the first divided clock CK_A.

The second output control circuit 124 illustrated in FIG. 2 may have configurations substantially the same as those of the first output control circuit 123 except for input/output signals.

Figure 5:
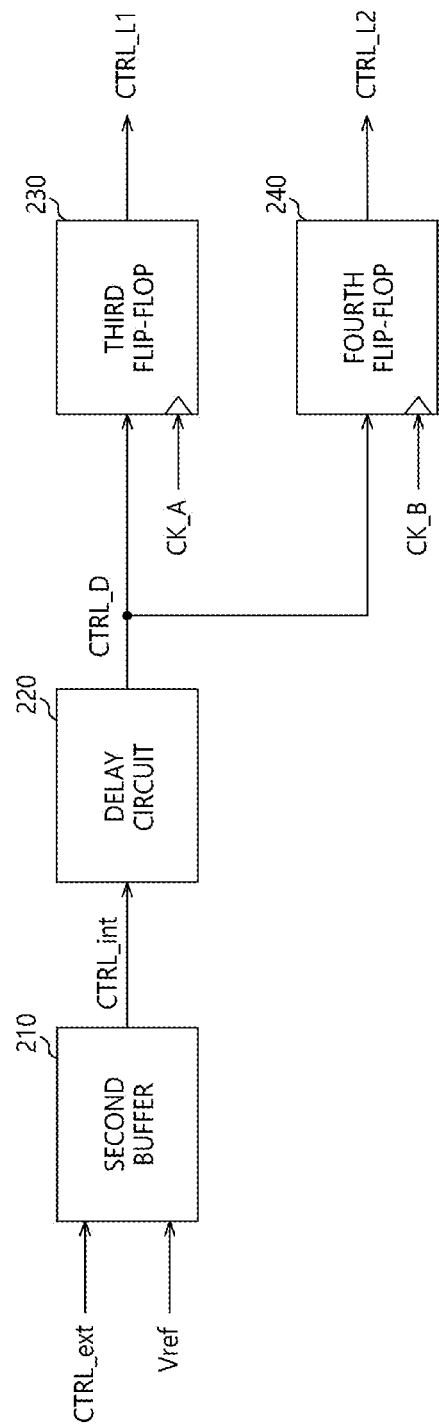

FIG. 5 is a circuit diagram illustrating a latch circuit in FIG. 1.

Referring to FIG. 5, the latch circuit 200 may include a second buffer 210, a delay circuit 220, a third flip-flop 230, and a fourth flip-flop 240.

The second buffer 210 may be configured to buffer the external control signal CTRL_ext. The second buffer 210 may output a buffered signal as an internal control signal CTRL_int. For example, the second buffer 210 may buffer the external control signal CTRL_ext based on the reference voltage Vref. The second buffer 210 may output the buffered external control signal CTRL_ext as the internal control signal CTRL_int.

The delay circuit 220 may be configured to delay the internal control signal CTRL_int for a predetermined time. The delay circuit 220 may output the delayed internal control signal CTRL_int as a delay control signal CTRL_D.

The third flip-flop 230 may be configured to latch the delay control signal CTRL_D in response to the first divided clock CK_A to output a delayed signal as the first latch control signal CTRL_L1. For example, the third flip-flop 230 may synchronize the delay control signal CTRL_D with the first divided clock CK_A to output a synchronized signal as the first latch control signal CTRL_L1.

The delay control signal CTRL_D may be inputted into an input terminal of the third flip-flop 230. The first divided clock CK_A may be inputted into a clock input terminal of the third flip-flop 230. The first latch control signal CTRL_L1 may be outputted from an output terminal of the third flip-flop 230.

The fourth flip-flop 240 may be configured to latch the delay control signal CTRL_D in response to the second divided clock CK_B to output a delayed signal as the second latch control signal CTRL_L2. For example, the fourth flip-flop 240 may synchronize the delay control signal CTRL_D with the second divided clock CK_B to output a synchronized signal as the second latch control signal CTRL_L2.

The delay control signal CTRL_D may be inputted into an input terminal of the fourth flip-flop 240. The second divided clock CK_B may be inputted into a clock input terminal of the fourth flip-flop 240. The second latch control signal CTRL_L2 may be outputted from an output terminal of the fourth flip-flop 240.

Figure 6:
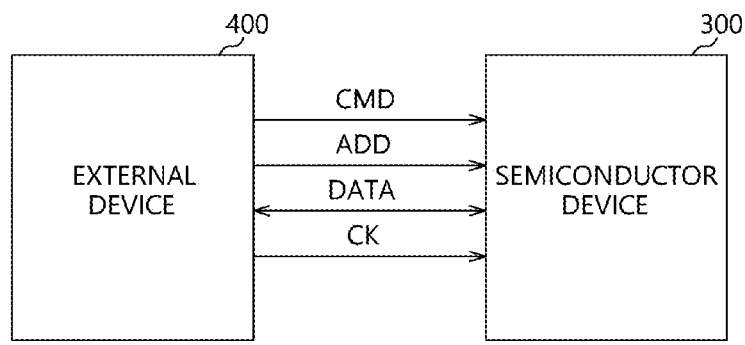

FIG. 6 is a block diagram illustrating a semiconductor system in accordance with example embodiments.

Referring to FIG. 6, a semiconductor system 500 of this example embodiment may include the semiconductor device 300 and an external device 400 connected to the semiconductor device 300.

The external device 400 may be configured to provide the semiconductor device 300 with a command CMD, an address ADD, data DATA, and the external clock CK.

The semiconductor device 300 may be configured to provide the data DATA to the external device 400 in response to the command CMD, the address ADD and the external clock CK. The command CMD and the address ADD as the external control signal CTRL_ext may be provided to the semiconductor device 300.

Hereinafter, operations of the semiconductor device 300 are illustrated in detail.

The semiconductor device 300 may receive the command CMD, the address ADD, the data DATA, and the external clock CK from the external device 400.

The semiconductor device 300 may synchronize the command CMD, the address ADD, and the data DATA with the external clock CK. The semiconductor device 300 may receive synchronized signals. Hereinafter, the command CMD and the address ADD may be designated as the external control signal CTRL_ext.

The semiconductor device 300 may include the division control circuit 100 and the latch circuit 200.

The division control circuit 100 may divide the external clock CK. The division control circuit 100 may output one or more of the first and second preliminary divided clocks CK_pA and CK_pB as one or more of the first and second divided clocks CK_A and CK_B or any one of the first and second divided clocks CK_A and CK_B in response to a disabled gear down enabling signal GDEN and the first and second NOP signals NOP_A and NOP_B are enabled, for example. In one example, the division control circuit 100 may output the first and second preliminary divided clocks CK_pA and CK_pB as the first and second divided clocks CK_A and CK_B when the gear down enabling signal GDEN is disabled.

When the gear down enabling signal GDEN is disabled, the first and second flip-flops 111 and 112 may disable the first and second latch NOP signals NOP_AL and NOP_BL.

When the first and second latch NOP signals NOP_AL and NOP_BL are disabled, the first and second latches 113 and 114 may enable the first and second divided clock output enabling signals CK_AEN and CK_BEN.

Thus, when the gear down enabling signal GDEN is disabled, the control signal-generating circuit 110 including the first and second flip-flops 111 and 112 and the first and second latches 113 and 114 may enable the first and second divided clock output enabling signals CK_AEN and CK_BEN.

The first buffer 121 may buffer at least one of the external clock CK and the external clock bar CKB to output the internal clock CK_int.

The dividing circuit 122 may divide the internal clock CK_int to generate the first and second preliminary divided clocks CK_pA and CK_pB having different phases.

The first output control circuit 123 may output the first preliminary divided clock CK_pA as the first divided clock CK_A or fix the first divided clock CK_A to a specific level in response to the first divided clock output enabling signal CK_AEN and the gear down enabling signal GDEN. For example, when the first divided clock output enabling signal CK_AEN is enabled or the gear down enabling signal GDEN is disabled, the first output control circuit 123 may output the first preliminary divided clock CK_pA as the first divided clock CK_A.

The second output control circuit 124 may output the second preliminary divided clock CK_pB as the second divided clock CK_B or fix the second divided clock CK_B to a specific level in response to the second divided clock output enabling signal CK_BEN and the gear down enabling signal GDEN. For example, when the second divided clock output enabling signal CK_BEN is enabled or the gear down enabling signal GDEN is disabled, the second output control circuit 124 may output the second preliminary divided clock CK_pB as the second divided clock CK_B.

The divided clock generation control circuit 120 including the first buffer 121, the dividing circuit 122, and the first and second output control circuits 123 and 124 may buffer the external clock CK. The divided clock generation control circuit 120 may divide the external clock CK to generate the first and second preliminary divided clocks CK_pA and CK_pB. The divided clock generation control circuit 120 may output the first and second preliminary divided clocks CK_pA and CK_pB as the first and second divided clocks CK_A and CK_B in response to the first and second divided clock output enabling signal CK_AEN and CK_BEN and, in one example, the gear down enabling signal GDEN. Alternatively the divided clock generation control circuit 120 may output any one of the first and second preliminary divided clocks CK_pA and CK_pB as any one of the first and second divided clocks CK_A and CK_B in response to the first and second divided clock output enabling signal CK_AEN and CK_BEN and, in one example, the gear down enabling signal GDEN.

Therefore, when the gear down enabling signal GDEN is disabled, the divided clock generation control circuit 120 may generate the first and second divided clocks CK_A and CK_B. The first and second divided clocks CK_A and CK_B may be provided to the latch circuit 200.

The second buffer 210 may buffer the external control signal CTRL_ext based on the reference voltage Vref. The delay circuit 220 may delay the internal control signal CTRL_int. The delay circuit 220 may output the delayed internal control signal CTRL_int as the delay control signal CTRL_D.

The third flip-flop 230 may synchronize the delay control signal CTRL_D with the first divided clock CK_A. The third flip-flop 230 may output a synchronized signal as the first latch control signal CTRL_L1.

The fourth flip-flop 240 may synchronize the delay control signal CTRL_D with the second divided clock CK_B. The fourth flip-flop 240 may output a synchronized signal as the second latch control signal CTRL_L2.

The latch circuit 200 including the second buffer 210, the delay circuit 220, and the third and fourth flip-flops 230 and 240 may latch the external control signal CTRL_ext using at least one of the first and second divided clocks CK_A and CK_B provided from the division control circuit 100 to output the first and second latch control signals CTRL_L1 and CTRL_L2.

When the gear down enabling signal GDEN is enabled, the first flip-flop 111 may latch the first NOP signal NOP_A and synchronize the first NOP signal NOP_A with the first preliminary divided clock CK_pA to output the first latch NOP signal NOP_AL.

When the gear down enabling signal GDEN is enabled, the second flip-flop 112 may latch the second NOP signal NOP_B and synchronize the second NOP signal NOP_B with the second preliminary divided clock CK_pB to output the second latch NOP signal NOP_BL.

When the second latch NOP signal NOP_BL is enabled, the first latch 113 may disable the first divided clock output enabling signal CK_AEN.

When the first latch NOP signal NOP_AL is enabled, the second latch 114 may disable the second divided clock output enabling signal CK_BEN.

Thus, when the gear down enabling signal GDEN is enabled, the control signal-generating circuit 110 including the first and second flip-flops 111 and 112 and the first and second latches 113 and 114 may enable any one of the first and second divided clock output enabling signals CK_AEN and CK_BEN and disable the other of the first and second divided clock output enabling signals CK_AEN and CK_BEN in response to the first and second NOP signals NOP_A and NOP_B. For example, when the first NOP signal NOP_A is enabled and the second NOP signal NOP_B is disabled, the control signal-generating circuit 110 may enable the first divided clock output enabling signal CK_AEN and disable the second divided clock output enabling signal CK_BEN. When the first NOP signal NOP_A is disabled and the second NOP signal NOP_B is enabled, the control signal-generating circuit 110 may disable the first divided clock output enabling signal CK_AEN and enable the second divided clock output enabling signal CK_BEN.

When the first divided clock output enabling signal CK_AEN is enabled and the second divided clock output enabling signal CK_BEN is disabled, the divided clock generation control circuit 120 may output only the first divided clock CK_A.

When the first divided clock output enabling signal CK_AEN is disabled and the second divided clock output enabling signal CK_BEN is enabled, the divided clock generation control circuit 120 may output only the second divided clock CK_B.

When only the first divided clock CK_A is inputted into the latch circuit 200, the third flip-flop 230 may synchronize the delay control signal CTRL_D with the first divided clock CK_A to output the first latch control signal CTRL_L1.

When only the second divided clock CK_B is inputted into the latch circuit 200, the fourth flip-flop 240 may synchronize the delay control signal CTRL_D with the second divided clock CK_B to output the second latch control signal CTRL_L2.

Therefore, when the semiconductor device 300 is not in the gear down mode, the semiconductor device 300 may receive the command and the address in response to the two divided clocks having different phases. In contrast, when the semiconductor device 300 is in the gear down mode, the semiconductor device may receive the command and the address in response to any one of the two divided clocks in accordance with the first and second NOP signals, i.e., the commands inputted from the external device.

The semiconductor system 500 including the semiconductor device 300 may operate a divided clock selected from the divided clocks when the semiconductor device 300 is in the gear down mode.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:
1. A semiconductor device comprising:
a division control circuit configured to divide an external clock to generate a first preliminary divided clock and a second preliminary divided clock and configured to output the first and second preliminary divided clocks or any one of the first and second preliminary divided clocks as first and second divided clocks; and
a latch circuit configured to latch an external control signal in response to the first and second divided clocks and configured to output first and second latch signals,
wherein the division control circuit outputs the first and second preliminary divided clocks as the first and second divided clocks when the gear down enabling signal is disabled, and the division control circuit outputs any one of the first and second preliminary divided clocks as any one of the first and second divided clocks in response to an enabled signal of first and second instruction signals when the gear down enabling signal is enabled.

2. The semiconductor device of claim 1, wherein the division control circuit is configured to output the first and second preliminary divided clocks as the first and second divided clocks or any one of the first and second preliminary divided clocks as any one of the first and second divided clocks in response to a gear down enabling signal and the first and second instruction (NOP) signals.

3. The semiconductor device of claim 2, wherein the gear down enabling signal comprises an output signal from a mode register set, the first and second instruction signals comprises signals inputted from an external device, and the gear down enabling signal is enabled by changing setups of the mode register set when the semiconductor device performs a power-up operation or is not in a self-refresh mode.

4. The semiconductor device of claim 1, wherein the division control circuit comprises:
a control signal-generating circuit configured to generate first and second divided clock output enabling signals in response to the first and second instruction signals, the first and second preliminary divided clocks and the gear down enabling signal; and
a divided clock generation control circuit configured to divide the external clock to generate the first and second preliminary divided clocks, and configured to output the first and second preliminary divided clocks as the first and second divided clocks or any one of the first and second preliminary divided clocks as any one of first and second divided clocks in response to the first and second divided clock output enabling signals.

5. The semiconductor device of claim 4, wherein the control signal-generating circuit is configured to enable the first and second divided clock output enabling signals when the gear down enabling signal is disabled, and the control signal-generating circuit is configured to enable any one of the first and second divided clock output enabling signals when the gear down enabling signal is disabled and any one of the first and second instruction signals is enabled.

6. The semiconductor device of claim 5, wherein the control signal-generating circuit comprises:
a first flip-flop configured to synchronize the first instruction signal with the first preliminary divided clock to output a first latch instruction signal when the gear down enabling signal is enabled;
a second flip-flop configured to synchronize the second instruction signal with the second preliminary divided clock to output a second latch instruction signal when the gear down enabling signal is enabled;
a first latch configured to generate the first divided clock output enabling signal in response to the second latch instruction signal when the gear down enabling signal is enabled; and
a second latch configured to generate the second divided clock output enabling signal in response to the first latch instruction signal when the gear down enabling signal is enabled.

7. The semiconductor device of claim 6, wherein the first and second flip-flops are configured to disable the first and second latch instruction signals when the gear down enabling signal is disabled.

8. The semiconductor device of claim 6, wherein the first and second latches are configured to enable the first and second divided clock output enabling signals when the gear down enabling signal is disabled.

9. The semiconductor device of claim 4, wherein the divided clock generation control circuit comprises:
a buffer configured to buffer the external clock to output an internal clock;
a dividing circuit configured to divide the internal clock to generate the first and second preliminary divided clocks;
a first output control circuit configured to output the first preliminary divided clock as the first divided clock in response to the gear down enabling signal and the first divided clock output enabling signal; and
a second output control circuit configured to output the second preliminary divided clock as the second divided clock in response to the gear down enabling signal and the second divided clock output enabling signal.

10. The semiconductor device of claim 9, wherein the first output control circuit is configured to output the first preliminary divided clock as the first divided clock when the gear down enabling signal is disabled or the first divided clock output enabling signal is enabled.

11. The semiconductor device of claim 9, wherein the second output control circuit is configured to output the second preliminary divided clock as the second divided clock when the gear down enabling signal is disabled or the second divided clock output enabling signal is enabled.

12. The semiconductor device of claim 1, wherein the latch circuit comprises:
a buffer configured to buffer the external control signal based on a reference voltage and configured to output an internal control signal;
a delay circuit configured to delay the internal control signal to output a delay control signal;
a first flip-flop configured to latch the delay control signal in response to the first divided clock to output a delayed signal as the first latch control signal; and
a second flip-flop configured to latch the delay control signal in response to the second divided clock to output a delayed signal as the second latch control signal.

13. A semiconductor system comprising:
an external device configured to provide an external control signal and an external clock; and
a semiconductor device configured to divide the external clock to generate a plurality of divided clocks, and configured to latch the external control signal using the divided clocks or any one of the divided clocks,
wherein the semiconductor device comprises:
a division control circuit configured to output first and second preliminary divided clocks as the first and second divided clocks or any one of the first and second preliminary divided clocks as any one of first and second divided clocks in response to a gear down enabling signal and first and second instruction signals; and a latch circuit configured to latch the external control signal in response to the first and second divided clocks and configured to output first and second latch signals, wherein the division control circuit outputs the first and second preliminary divided clocks as the first and second divided clocks when the gear down enabling signal is disabled, and the division control circuit outputs any one of the first and second preliminary divided clocks as any one of the first and second divided clocks in response to an enabled signal of the first and second instruction signals when the gear down enabling signal is enabled.

14. The semiconductor system of claim 13, wherein the gear down enabling signal comprises an output signal from a mode register set, the first and second instruction signals comprises signals inputted from the external device.

15. The semiconductor system of claim 13, wherein the division control circuit comprises:
a control signal-generating circuit configured to generate first and second divided clock output enabling signals in response to the first and second NOP signals, the first and second preliminary divided clocks and the gear down enabling signal; and
a divided clock generation control circuit configured to divide the external clock to generate the first and second preliminary divided clocks, and configured to output the first and second preliminary divided clocks as the first and second divided clocks or any one of the first and second preliminary divided clocks as any one of first and second divided clocks in response to the first and second divided clock output enabling signals.

16. The semiconductor system of claim 15, wherein the control signal-generating circuit is configured to enable the first and second divided clock output enabling signals when the gear down enabling signal is disabled, and the control signal-generating circuit is configured to enable any one of the first and second divided clock output enabling signals when the gear down enabling signal is disabled and any one of the first and second instruction signals is enabled.

17. The semiconductor system of claim 15, wherein the divided clock generation control circuit comprises:
a buffer configured to buffer the external clock to output an internal clock;
a dividing circuit configured to divide the internal clock to generate the first and second preliminary divided clocks;
a first output control circuit configured to output the first preliminary divided clock as a first divided clock in response to the gear down enabling signal and the first divided clock output enabling signal;
a second output control circuit configured to output the second preliminary divided clock as the second divided clock in response to the gear down enabling signal and the second divided clock output enabling signal.

* * * * *